US011851758B2

(12) United States Patent
Agarwal et al.

(10) Patent No.: US 11,851,758 B2
(45) Date of Patent: Dec. 26, 2023

(54) FABRICATION OF A HIGH TEMPERATURE SHOWERHEAD

(71) Applicant: Applied Materials, Inc., Santa Clara, CA (US)

(72) Inventors: Sumit Agarwal, Dublin, CA (US); Katherine Woo, Santa Clara, CA (US); Shawyon Jafari, Sunnyvale, CA (US); Jian Li, Fremont, CA (US); Chidambara A. Ramalingam, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/235,258

(22) Filed: Apr. 20, 2021

(65) Prior Publication Data

US 2022/0333244 A1 Oct. 20, 2022

(51) Int. Cl.
  *C23C 16/455* (2006.01)
  *B22D 30/00* (2006.01)

(52) U.S. Cl.
  CPC ........ *C23C 16/45565* (2013.01); *B22D 30/00* (2013.01); *C23C 16/45525* (2013.01); *Y10T 29/49433* (2015.01)

(58) Field of Classification Search
  CPC .............................................. Y10T 29/49433
  See application file for complete search history.

(56) References Cited

U.S. PATENT DOCUMENTS

| 6,106,625 A | 8/2000 | Koai et al. |
| 6,576,053 B1 * | 6/2003 | Kim ................... H01L 21/02181 |
| | | 257/E21.271 |
| 6,830,652 B1 * | 12/2004 | Ohmi ................ C23C 16/45578 |
| | | 118/723 MW |

(Continued)

FOREIGN PATENT DOCUMENTS

| EP | 3521479 A1 | 8/2019 |
| JP | 3835376 B2 | 8/2006 |
| KR | 100528029 B1 * | 11/2005 |

OTHER PUBLICATIONS

English Machine Translation of JP3835376B2 (Year: 2006).*

(Continued)

*Primary Examiner* — Sarang Afzali
(74) *Attorney, Agent, or Firm* — Kilpatrick Townsend & Stockton LLP

(57) ABSTRACT

Methods of manufacturing a semiconductor processing chamber showerheads may include forming a melted aluminum alloy composition, cooling the melted aluminum alloy composition at a rate of at least 103 K/sec to form solid aluminum alloy particles, and forming a core region of a showerhead from the solid aluminum alloy particles. The core region of the showerhead may include an inner core region and an outer core region that may be coupled together. The inner core region may define a plurality of apertures. The outer core region may define a channel that receives a heating element. The methods may include coating the core region with one of aluminum or aluminum oxide and joining a peripheral edge of the outer core region with (Continued)

an inner edge of a metallic annular liner. The metallic annular liner may have a lower thermal conductivity than the core region of the showerhead.

11 Claims, 5 Drawing Sheets

(56) References Cited

U.S. PATENT DOCUMENTS

| | | |
|---|---|---|
| 7,645,341 B2 | 1/2010 | Kennedy et al. |
| 2004/0129211 A1 | 7/2004 | Blonigan et al. |
| 2009/0095334 A1 | 4/2009 | Huston |
| 2010/0077825 A1* | 4/2010 | Chipko .................... C22F 1/04 |
| | | 72/364 |
| 2018/0094338 A1* | 4/2018 | Yamamoto ............. B22D 27/20 |
| 2020/0040452 A1 | 2/2020 | Hwung et al. |

OTHER PUBLICATIONS

English Machine Translation of KR100528029B1 (Year: 2005).*
Application No. PCT/US2022/023270, International Search Report and Written Opinion, dated Jul. 27, 2022, 11 pages.

* cited by examiner

FABRICATION OF A HIGH TEMPERATURE SHOWERHEAD

TECHNICAL FIELD

The present technology relates to components and apparatuses for semiconductor manufacturing. More specifically, the present technology relates to processing chamber distribution components and other semiconductor processing equipment.

BACKGROUND OF THE INVENTION

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. To promote symmetry and uniformity, many chamber components may include regular patterns of features, such as apertures, for providing materials in a way that may increase uniformity. However, this may limit the ability to tune recipes for on-wafer adjustments.

Thus, there is a need for improved systems and methods that can be used to produce high quality devices and structures. These and other needs are addressed by the present technology.

BRIEF SUMMARY OF THE INVENTION

Exemplary semiconductor processing chamber showerheads include an inner core region. The inner core region may define a plurality of apertures. The showerheads may include an outer core region disposed about an outer periphery of the inner core region. The outer core region may define an annular channel. The showerheads may include a heating element disposed within the annular channel. The showerheads may include an annular liner disposed about an outer periphery of the outer core region. The inner core region and the outer core region may include an aluminum alloy. The annular liner may have a lower thermal conductivity than the aluminum alloy.

In some embodiments, a thermal conductivity of the annular liner may be less than about 20% of a thermal conductivity of the aluminum alloy. A coefficient of thermal expansion of the annular liner may be within about 50% of a coefficient of thermal expansion of the aluminum alloy. The annular liner may include one or both of stainless steel and titanium. The annular liner and the outer core region may be joined using a solid-state joining technique. The aluminum alloy may have a generally homogenous microstructure. The showerheads may include an intermediate material disposed between the outer core region and the annular liner. The intermediate material may have a coefficient of thermal expansion that is between a coefficient of thermal expansion of the aluminum alloy and a coefficient of thermal expansion of the annular liner.

Some embodiments of the present technology may encompass methods of manufacturing semiconductor processing chamber showerheads. The methods may include forming a melted aluminum alloy composition. The methods may include cooling the melted aluminum alloy composition at a rate of at least $10^3$ K/sec to form solid aluminum alloy particles. The methods may include forming a showerhead from the solid aluminum alloy particles. The methods may include coating the showerhead with one of aluminum or aluminum oxide.

In some embodiments, coating the showerhead may include electroplating aluminum onto the showerhead. Coating the showerhead may include applying aluminum oxide onto the showerhead via atomic layer deposition. Forming the showerhead may include compacting the solid aluminum alloy particles. Forming the showerhead may include forming a showerhead blank from the compacted solid aluminum alloy particles. Forming the showerhead may include machining the showerhead blank to form the showerhead. Forming the showerhead may include forging or extruding the compacted solid aluminum alloy particles prior to forming the showerhead blank. An aluminum alloy portion of the showerhead may have an electrical resistivity of less than about 10 microohm cm. An aluminum alloy portion of the showerhead may have a thermal conductivity of at least about 100 W/m K. Cooling the melted aluminum alloy composition may include one or more selected from a group comprising flash freezing, quenching, and powder atomization.

Some embodiments of the present technology may encompass methods of manufacturing semiconductor processing chamber showerheads. The methods may include forming a melted aluminum alloy composition. The methods may include cooling the melted aluminum alloy composition at a rate of at least $10^3$ K/sec to form solid aluminum alloy particles. The methods may include forming a core region of a showerhead from the solid aluminum alloy particles. The methods may include coating the core region of the showerhead with one of aluminum or aluminum oxide. The methods may include joining a peripheral edge of the core region of the showerhead with an annular liner. The annular liner may have a lower thermal conductivity than the core region of the showerhead.

In some embodiments, the core region of the showerhead may include an inner core region and an outer core region that is disposed about an outer periphery of the inner core region. The inner core region may define a plurality of apertures. The outer core region may define a channel that receives a heating element. The methods may include coupling the inner core region and the outer core region using one or both of a friction stir weld or an electron beam weld. Joining the peripheral edge of the core region of the showerhead with the annular liner may include using a solid-state joining technique. Joining the peripheral edge of the core region of the showerhead with the annular liner may include coupling an intermediate material between the peripheral edge of the core region and the annular liner. The intermediate material may have a coefficient of thermal expansion that is between a coefficient of thermal expansion of the core region and a coefficient of thermal expansion of the annular liner.

Such technology may provide numerous benefits over conventional systems and techniques. For example, embodiments of the present technology may provide showerheads that are able to withstand higher processing temperatures without losing strength, deforming, or exhibiting creep. This enables higher temperature processing operations to be performed, which may lead to less byproduct deposition on the showerhead and wafer, as well as fewer defects on wafer. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
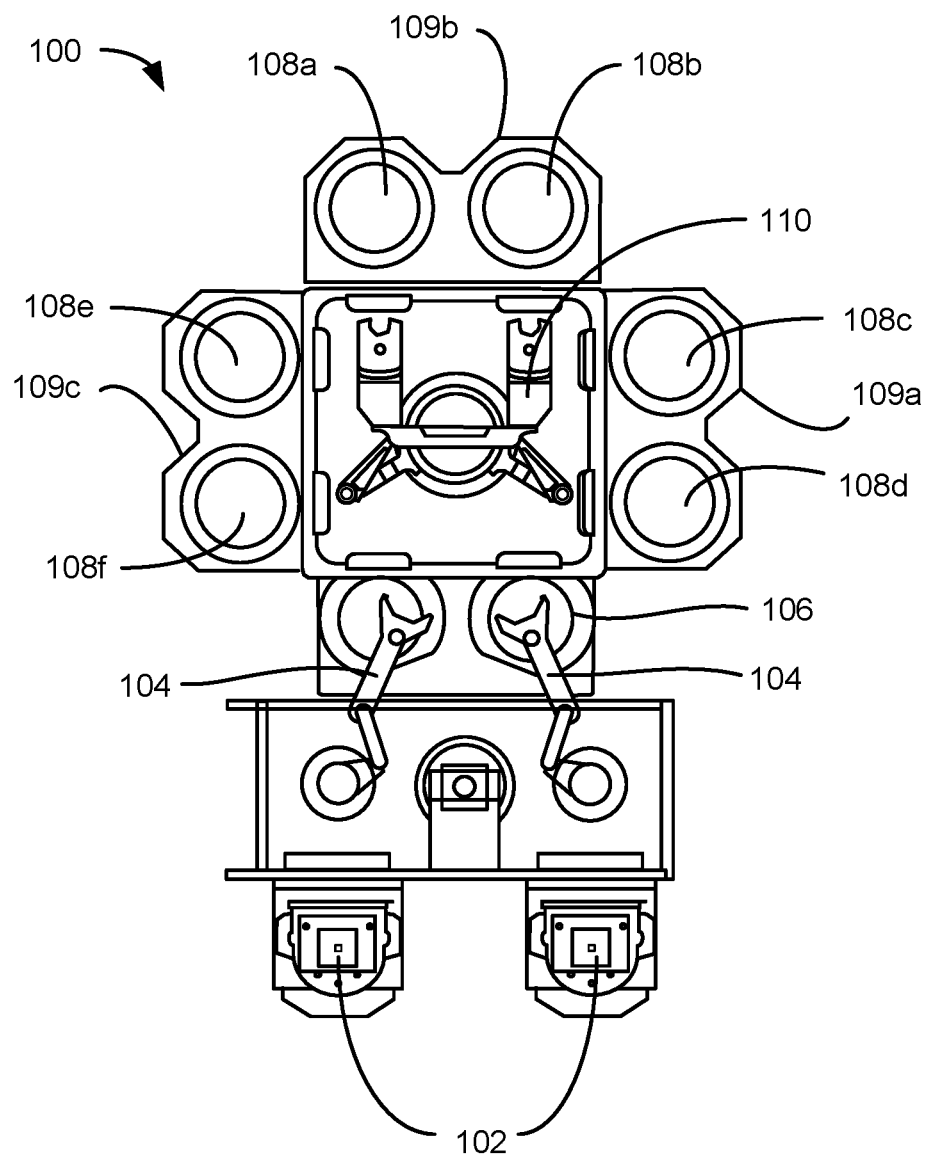
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. The precursors may be distributed through one or more components within the chamber, which may produce a radial or lateral distribution of delivery to provide increased formation or removal at the substrate surface.

As device features reduce in size, tolerances across a substrate surface may be reduced, and material property differences across a film may affect device realization and uniformity. Many chambers include a characteristic process signature, which may produce non-uniformity across a substrate. Temperature differences, flow pattern uniformity, and other aspects of processing may impact the films on the substrate, creating film uniformity differences across the substrate for materials produced or removed. For example, one or more devices may be included within a processing chamber for delivering and distributing precursors within a processing chamber. A blocker plate may be included in a chamber to provide a choke in precursor flow, which may increase residence time at the blocker plate and lateral or radial distribution of precursors. A showerhead may further improve uniformity of delivery into a processing region, which may improve deposition or etching.

Some semiconductor processing operations include high processing temperatures, which may exceed 350° C. Such high processing temperatures may provide several benefits, such as reducing residue build up on the showerhead and other chamber components, reducing the occurrence of fall-on defects, shortening cleaning times, and increasing deposition rates. Typically, showerheads are formed from aluminum alloys due to the low electrical resistivity of aluminum. However, conventional aluminum alloys suffer from strength losses, deformation, and creep when exposed to processing temperatures that exceed 200° C., which may make the showerheads unsuitable for high temperature processing operations.

The present technology overcomes these challenges by forming showerheads from aluminum alloys that are cooled at rates of at least $10^3$ K/s, which may create aluminum alloys that are more heat-resistant. These aluminum alloys may have greater strength than conventional aluminum alloys under both short and prolonged exposure to high temperatures, and may provide greater resistance to deformation and creep in high temperature environments. Additionally, the present technology provides showerhead designs that include an annular liner that is formed of a material that has a lower thermal conductivity than the aluminum alloy. This may enable the annular liner to better isolate thermally-sensitive components, such as O-rings or other seals, from the high temperatures within the processing chamber. The present technology may enable high temperature processing operations to be performed, while may result in reduced residue build up on the showerhead and other chamber components, fewer fall-on defects, quicker cleaning times, and higher deposition rates.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments of the present technology. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
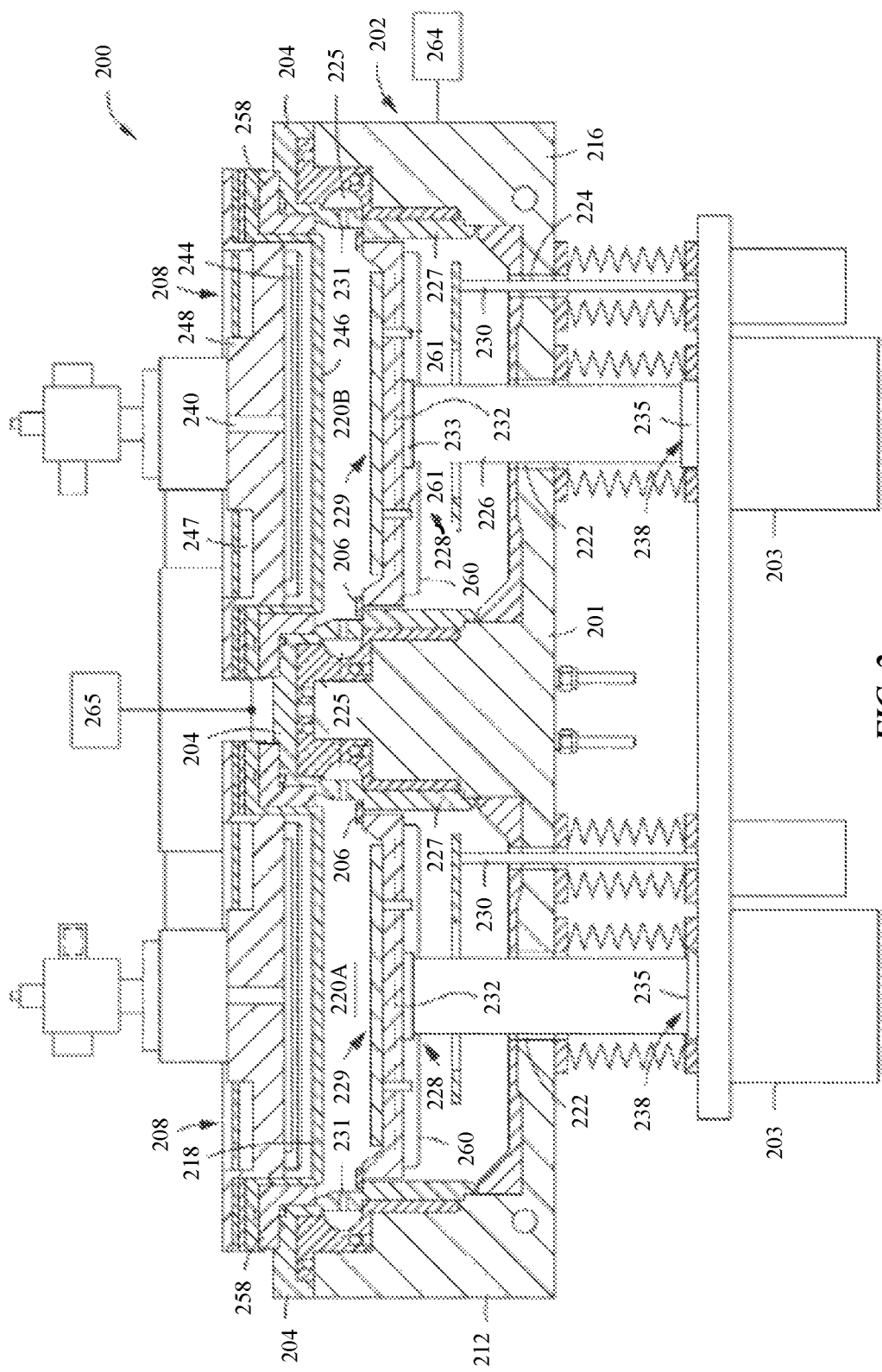
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology as further described below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
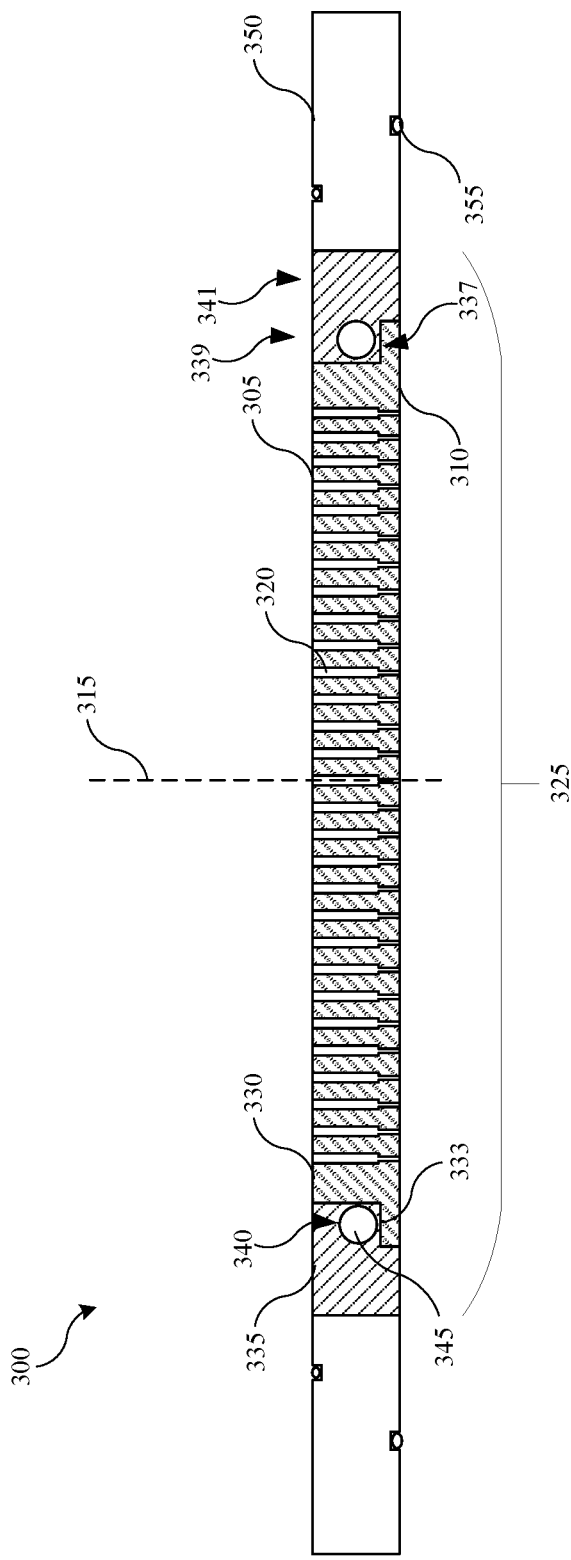
FIG. 3 shows a schematic partial cross-sectional view of an exemplary showerhead according to some embodiments of the present technology.

FIG. 3 shows a schematic partial cross-sectional view of an exemplary faceplate or showerhead 300 according to some embodiments of the present technology. FIG. 3 may illustrate further details relating to components in system 200, such as for faceplate 246. Showerhead 300 is understood to include any feature or aspect of system 200 discussed previously in some embodiments. The showerhead 300 may be used to perform semiconductor processing operations including deposition of hardmask materials as previously described, as well as other deposition, removal, and cleaning operations. Showerhead 300 may show a partial view of a faceplate that may be incorporated in a semiconductor processing system, and may illustrate a view across a center of the faceplate, which may otherwise be of any size, and include any number of apertures. Although shown with a number of apertures extending outward laterally or radially, it is to be understood that the figure is included only for illustration of embodiments, and is not considered to be of scale. For example, exemplary faceplates may be characterized by a number of apertures along a central diameter of greater than or about 20 apertures as will be described further below, and may be characterized by greater than or about 25 apertures, greater than or about 30 apertures, greater than or about 35 apertures, greater than or about 40 apertures, greater than or about 45 apertures, greater than or about 50 apertures, or more.

As noted, showerhead 300 may be included in any number of processing chambers, including system 200 described above. Showerhead 300 may be included as part of the gas inlet assembly, such as with a gasbox and blocker plate. For example, a gasbox may define or provide access into a processing chamber. A substrate support may be included within the chamber, and may be configured to support a substrate for processing. A blocker plate may be included in the chamber between the gasbox and the substrate support. The blocker plate may include or define a number of apertures through the plate. The components may include any of the features described previously for similar components, as well as a variety of other modifications similarly encompassed by the present technology.

Showerhead 300 may be positioned within the chamber between the blocker plate and the substrate support as illustrated previously. Showerhead 300 may be characterized by a first surface 305 and a second surface 310, which may be opposite the first surface. In some embodiments, first surface 305 may be facing towards a blocker plate, gasbox, or gas inlet into the processing chamber. Second surface 310 may be positioned to face a substrate support or substrate within a processing region of a processing chamber. For example, in some embodiments, the second surface 310 of the faceplate and the substrate support may at least partially define a processing region within the chamber. Showerhead 300 may be characterized by a central axis 315, which may extend vertically through a midpoint of the showerhead, and may be coaxial with a central axis through the processing chamber.

Showerhead 300 may define a plurality of apertures 320 defined through the showerhead and extending from the first surface 305 through the second surface 310. Each aperture 320 may provide a fluid path through the showerhead 300, and the apertures 320 may provide fluid access to the processing region of the chamber. Depending on the size of the showerhead 300, and the size of the apertures, showerhead 300 may define any number of apertures through the plate, such as greater than or about 1,000 apertures, greater than or about 2,000 apertures, greater than or about 3,000 apertures, greater than or about 4,000 apertures, greater than or about 5,000 apertures, greater than or about 6,000 apertures, or more. As noted above, the apertures may be included in a set of rings extending outward from the central axis, and may include any number of rings as described previously. The rings may be characterized by any number of shapes including circular or elliptical, as well as any other geometric pattern, such as rectangular, hexagonal, or any other geometric pattern that may include apertures distributed in a radially outward number of rings. The apertures may have a uniform or staggered spacing, and may be spaced apart at less than or about 10 mm from center to center. The apertures may also be spaced apart at less than or about 9 mm, less than or about 8 mm, less than or about 7 mm, less than or about 6 mm, less than or about 5 mm, less than or about 4 mm, less than or about 3 mm, or less.

The rings may be characterized by any geometric shape as noted above, and in some embodiments, apertures may be characterized by a scaling function of apertures per ring. For example, in some embodiments a first aperture may extend through a center of the faceplate, such as along the central axis as illustrated. A first ring of apertures may extend about the central aperture, and may include any number of apertures, such as between about 4 and about 10 apertures, which may be spaced equally about a geometric shape extending through a center of each aperture. Any number of additional rings of apertures may extend radially outward from the first ring, and may include a number of apertures that may be a function of the number of apertures in the first ring. For example, the number of apertures in each successive ring may be characterized by a number of apertures within each corresponding ring according to the equation XR, where X is a base number of apertures, and R is the corresponding ring number. The base number of apertures may be the number of apertures within the first ring, and in some embodiments may be some other number, as will be described further below where the first ring has an augmented number of apertures. For example, for an exemplary faceplate having 5 apertures distributed about the first ring, and where 5 may be the base number of apertures, the second ring may be characterized by 10 apertures, (5)×(2), the third ring may be characterized by 15 apertures, (5)×(3), and the twentieth ring may be characterized by 100 apertures, (5)×(20). This may continue for any number of rings of apertures as noted previously, such as up to, greater than, or about 50 rings. In some embodiments each aperture of the plurality of apertures across the faceplate may be characterized by an aperture profile, which may be the same or different in embodiments of the present technology.

Showerhead 300 may include a core region 325. Core region 325 may be formed from one or more aluminum alloys, including, but not limited to, the aluminum alloys discussed herein. The core region 325 may be coated with aluminum and/or aluminum oxide in some embodiments, which may help prevent trace metal contamination of metallic elements within the aluminum alloy that may otherwise migrate out of the aluminum alloy when exposed to high temperatures. The aluminum alloy of the core region 325 may have a thermal conductivity of greater than or about 100 W/m K, greater than or about 110 W/m K, greater than or about 120 W/m K, greater than or about 130 W/m K, greater than or about 140 W/m K, greater than or about 150 W/m K, greater than or about 160 W/m K, greater than or about 170 W/m K, or more. The aluminum alloy of the core region 325 may have an electrical resistivity of less than about 10 microohm cm, less than about 9 microohm cm, less than about 8 microohm cm, less than about 7 microohm cm, less than about 6 microohm cm, less than about 5 microohm cm, less than about 4 microohm cm, less than about 3 microohm cm, or less. Such levels of electrical resistivity may enable the showerhead 300 to function as both a ground and as a cathode during processing operations. The aluminum alloy of the core region 325 may have a coefficient of thermal expansion of between about 17 and 24, between about 18 and 23, between about 19 and 22, or between about 20 and 21. In some embodiments, the aluminum alloy of the core region 325 may have a generally homogenous microstructure, which may provide increased strength and heat-resistance properties to the showerhead 300.

Core region 325 may include an inner core region 330 and an outer core region 335. The inner core region 330 may include the apertures 320. The outer core region 335 may be disposed about an outer periphery of the inner core region 330 and may be radially outward of an outermost ring or row of apertures 320. The inner core region 330 may be generally circular or disc-shaped. The outer core region 330 may be annular in shape, with an inner diameter of a central opening of the outer core region 330 matching an outer diameter of the inner core region 330 such that the inner core region 330 may be received within the central opening of the outer core region 330. A peripheral edge of the inner core region 330 may include a step 333 on which an inner portion 337 of a lower surface of the outer core region 335 may be seated. The peripheral edge of the inner core region 330 may be joined with an inner edge of the outer core region 335. In some embodiments, the joining may be performed using electron beam welding. In other embodiments, the joining may be performed using one or more solid-state techniques, such as friction stir welding. The use of solid-state joining techniques prevents the aluminum alloy of the core region 325 from needing to be melted and later re-solidified, which may help preserve the mechanical properties (strength, creep/deformation resistance, etc.) of the aluminum alloy. In some embodiments, the inner core region 330 and outer core region 335 may be formed integrally and may not need to be joined.

The outer core region 335 may include an inner section 339 and an outer section 341. The inner section 339 of the outer core region 335 may define an annular channel 340, which may encircle the inner core region 330. The inner section 339 may be defined as a portion of the outer core region 335 that defines the annular channel 340 and/or that is disposed above step 333, while the outer section 341 may be defined as the portion of the outer core region 335 that is radially outward of the heating element 345 and/or step 333. A heating element 345 may be disposed within the annular channel 340. Heating element 345 may be used to heat the core region 325 of the showerhead 300 during processing and/or cleaning operations. For example, the heating element may be coupled with a power source, such as an AC power source, which may supply a current to the heating element to increase the temperature of the core region 325 of the showerhead 300. The heating element 345 and annular channel 340 may be positioned proximate the inner portion 337 of the lower surface. This may position the heating element 345 above step 333 and proximate the peripheral edge of the inner core region 330, which may help to maximize heat conductance to the inner core region 330. The outer section 341 of the outer core region 335 may have a width that is at least as wide as the inner section 339. For example, a width of the outer section 341 may be at least or about 100% of a width of the inner section 339, at least or about 100% of a width of the inner section 339, at least or about 100% of a width of the inner section 339, at least or about 110% of a width of the inner section 341, at least or about 120% of a width of the inner section 339, at least or about 130% of a width of the inner section 339, at least or about 140% of a width of the inner section 339, at least or about 150% of a width of the inner section 339, or greater. Such a width of the outer section 341 may provide additional material that may help thermally shield outer components of the showerhead 300 from heat from the heating element 345 and/or processing chamber.

Showerhead 300 may include an annular liner 350 that is disposed about an outer periphery of the outer core region 335. The peripheral edge of the outer core region 334 may be joined with an inner edge of the annular liner 350. The joining may be performed using one or more solid-state techniques, such as friction stir welding. The use of solid-state joining techniques prevents the aluminum alloy of the core region 325 from needing to be melted and later re-solidified, which may help preserve the mechanical properties (strength, creep/deformation resistance, etc.) of the aluminum alloy.

The annular liner 350 may define one or more channels that may receive O-rings 355 and/or other sealing members that may seal the process volume. The annular liner 350 may have a lower thermal conductivity than the aluminum alloy of the core region 325. For example, a thermal conductivity of the annular liner 350 may be less than or about 20%, less than or about 15%, less than or about 10%, or less than the thermal conductivity of the aluminum alloy. In particular embodiments, the thermal conductivity of the annular liner 350 may be less than or about 35 W/m K, less than or about 30 W/m K, less than or about 25 W/m K, less than or about 20 W/m K less, than or about 15 W/m K, less than or about 10 W/m K, or less. The relatively low thermal conductivity of the annular liner 350 may enable the annular liner 350 to isolate or otherwise thermally shield various components, such as O-rings 355 and/or other temperature-sensitive components, from high temperatures of the showerhead 300, which may exceed 350° C. in many high temperature processing operations. This may enable usage of conventional O-rings 355. In one particular embodiment, the annular liner 350 may be formed from stainless steel, however other metallic materials having low thermal conductivity may be used in various embodiments.

A coefficient of thermal expansion of the annular liner 350 may be within about 50%, within about 40%, within about 30%, within about 20%, within about 10%, within about 5%, or less of a coefficient of thermal expansion of the aluminum alloy of the core region 325. For example, the annular liner 350 may have a coefficient of thermal expansion of between about 14 and 18 or between about 16 and 18. By having coefficients of thermal expansion that are within the ranges above, a robust coupling of the aluminum alloy of the and annular liner 350 may be achieved with a low risk of thermal stress issues.

Figure 3A:
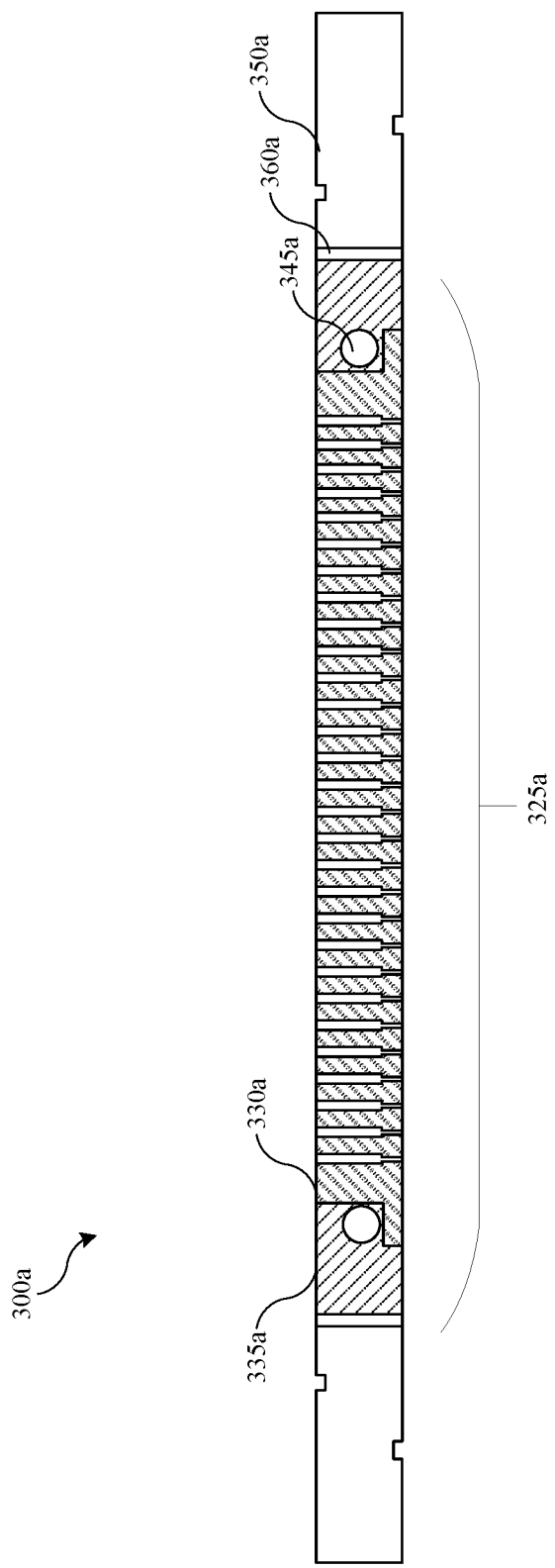
FIG. 3A shows a schematic partial cross-sectional view of an exemplary showerhead according to some embodiments of the present technology.

In some embodiments, an aluminum alloy and a material for the annular liner may be chosen that have very different coefficients of thermal expansion. For example, the coefficients of thermal expansion of the aluminum alloy may exceed a coefficient of thermal expansion of the annular liner by greater than or about 70%, greater than or about 80%, greater than or about 90%, greater than or about 100%, greater than or about 125%, greater than or about 150%, greater than or about 175%, greater than or about 200%, or greater. For example, of the annular liner 350 may have a coefficient of thermal expansion of between about 8 and 10, while the aluminum alloy of the core region may have a coefficient of thermal expansion of between about 17 and 24. In one particular embodiment, the annular liner 350 may include stainless steel and/or titanium, however other metallic materials having low thermal conductivity may be used in various embodiments. FIG. 3A shows a schematic partial cross-sectional view of an exemplary showerhead 300a that may enable such a mismatch of coefficients of thermal expansion for an annular liner 350a and a core region 325a according to some embodiments of the present technology. Showerhead 300a may be similar to showerhead 300 and may include any of the features described above. For example, showerhead 300a may include a core region 325a having an inner core section 330a and an outer core section 335a. The outer core section 335a may include a heating element 345a. Annular liner 350a may be disposed about the peripheral edge of the outer core section 335a. Showerhead 300a may include an intermediate material 360a that is disposed between the outer core region 335a and the annular liner 350a. The intermediate material 360a may have a coefficient of thermal expansion that is between a coefficient of thermal expansion of the aluminum alloy of the core region 325a and the annular liner 350a, which may help bridge the thermal expansion mismatch between the two components. For example, the intermediate material 360a may have a coefficient of thermal expansion of between about 12 and 20. In a particular embodiment, the intermediate material 360a may include silver, however other metallic materials having a coefficient of thermal expansion within the range above may be used in various embodiments. The use of the intermediate material 360a may enable an aluminum alloy and material for the annular liner 350a to be selected that have very different coefficients of thermal expansion without a high risk of damage from thermal stresses. This may, in some embodiments, enable annular liners 350a that include materials with exceptionally low thermal conductivity to be utilized to better thermally shield heat-sensitive components.

Figure 4:
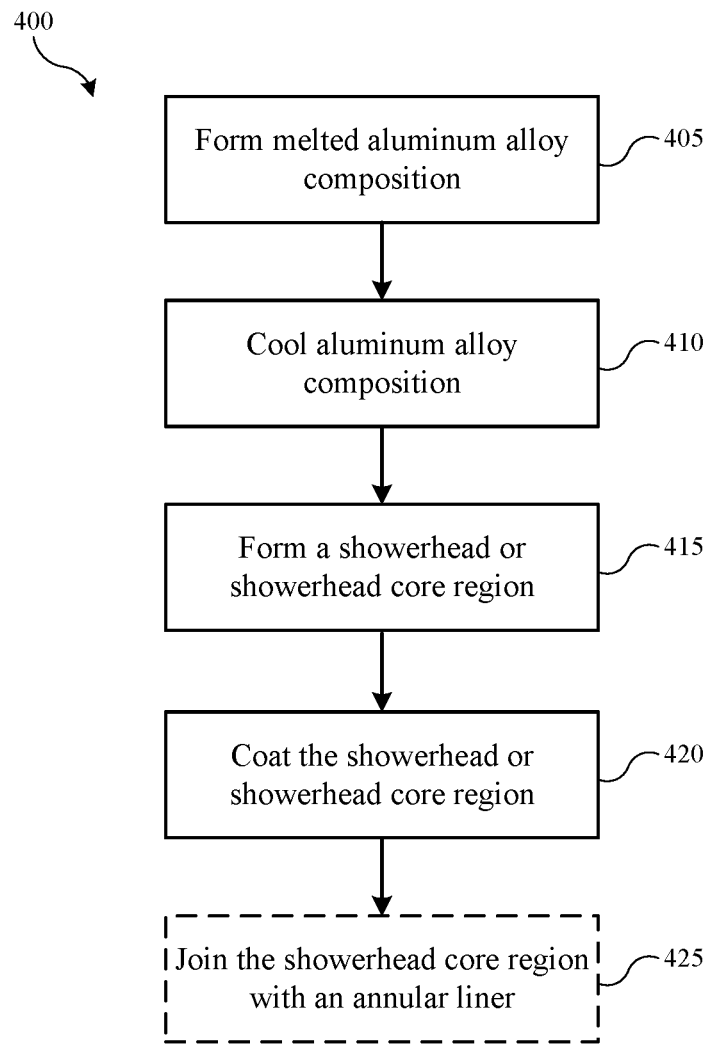
FIG. 4 shows operations of an exemplary method of manufacturing semiconductor processing chamber showerheads according to some embodiments of the present technology.

FIG. 4 shows operations of an exemplary method 400 of manufacturing a semiconductor processing chamber showerhead according to some embodiments of the present technology. The method may be used to manufacture a variety of showerheads, including, but not limited to, showerheads 300 and 300a described above. Method 400 may include a number of optional operations, which may or may not be specifically associated with some embodiments of methods according to the present technology.

Method 400 may include optional operations prior to initiation of method 400, or the method may include additional operations. For example, method 400 may include operations performed in different orders than illustrated. In some embodiments, method 400 may include forming a melted aluminum alloy composition at operation 405. The aluminum alloy composition may have a thermal conductivity of greater than or about 100 W/m K, greater than or about 110 W/m K, greater than or about 120 W/m K, greater than or about 130 W/m K, greater than or about 140 W/m K, greater than or about 150 W/m K, greater than or about 160 W/m K, greater than or about 170 W/m K, or more. The aluminum alloy composition may have an electrical resistivity of less than about 10 microohm cm, less than about 9 microohm cm, less than about 8 microohm cm, less than about 7 microohm cm, less than about 6 microohm cm, less than about 5 microohm cm, less than about 4 microohm cm, less than about 3 microohm cm, or less. Such levels of electrical resistivity may enable the showerhead to function as both a ground and as a cathode during processing operations.

The aluminum alloy composition may include a mixture of aluminum, iron, vanadium, and/or silicon, with each component making up at least 0.5% by weight of the aluminum alloy. The composition may include a ratio of iron to vanadium of greater than or about 1.5:1, greater than or about 2:1, greater than or about 2.5:1, greater than or about 3:1, greater than or about 3.5:1, greater than or about 4:1, greater than or about 4.5:1, greater than or about 5:1, greater than or about 6:1, or greater. Such a ratio may reduce the electrical resistivity of the resultant aluminum alloy while increasing the strength of the aluminum alloy. The composition may include a ratio of iron to silicon of greater than or about 2.5:1, greater than or about 3:1, greater than or about 3.5:1, greater than or about 4:1, greater than or about 5:1, greater than or about 6:1, greater than or about 7:1, or greater. The composition may include a ratio of silicon to vanadium of greater than or about 1:1, greater than or about 1.25:1, greater than or about 1.5:1, or greater.

In another embodiment, the aluminum alloy composition may include a mixture of aluminum and copper. The composition may include a number of other elements, such as, but not limited to, iron, magnesium, manganese, titanium, nickel, molybdenum, and/or zirconium, with each of these elements being present in quantities of at least about 0.5% by weight. In some embodiments, the composition may include less than about 0.5% by weight of silicon. The composition may include a ratio of aluminum to copper of greater than or about 20:1, greater than or about 25:1, greater than or about 30:1, greater than or about 35:1, or greater. The composition may include a ratio of copper to iron of greater than or about 0.5:1, greater than or about 0.75:1, greater than or about 1:1, greater than or about 1.25:1, greater than or about 1.5:1, or greater. It will be appreciated that the alloy compositions detailed above are merely examples, and that other aluminum alloys that have the desired thermal conductivity and electrical resistivity.

At operation 410, method 400 may include cooling the melted aluminum alloy composition at a rate of at least or about $10^3$K/sec, at least or about $10^4$K/sec, at least or about $10^5$ K/sec, at least or about $10^6$ K/sec, at least or about $10^7$ K/sec, or greater. For example, the melted aluminum alloy composition may be cooled using flash freezing, quenching, powder atomization, and/or other process that cools the aluminum alloy at such rates. Cooling the aluminum alloy at such rates may generate solid aluminum alloy particles that have generally homogenous microstructures that are on the order of less than 1 micron in size, rather than multi-phase microstructures found in alloys produced using conventional aluminum alloy manufacturing processes which produce larger particles over a greater range of particle size distribution. The homogenous microstructure of the cooled aluminum alloy may provide increased strength and stability/heat resistance over conventionally formed aluminum alloys and may make the aluminum alloy of the present invention suitable for use in high temperature showerhead applications.

At operation 415, all or part of a showerhead may be formed from the solid aluminum alloy particles. For example, in some embodiments a core region of a showerhead may be formed from the solid aluminum alloy particles. Forming the showerhead may include chopping and/or otherwise breaking the particles into smaller pieces. The particles and/or smaller pieces may be compacted. For example, the particles and/or smaller pieces may be compacted using hot isostatic pressing to compress the particles and/or smaller pieces to achieve a greater uniformity of density. After compaction, the particles and/or smaller pieces may be forged and/or extruded, which may form a showerhead blank with a general shape and size for the showerhead and/or core region. The forging and/or extrusion of the aluminum alloy may further increase the uniformity of density to greater than about 95%, greater than or about 96%, greater than or about 97%, greater than or about 98%, greater than or about 99%, greater than or about 99.5%, or greater. The extrusion and/or forging processes may impart the final thermal conductivity, electrical resistivity, strength, and/or thermal resistance properties on the aluminum alloy. Once the showerhead blank is formed, a showerhead and/or core region of a showerhead may be formed from the blank. For example, the showerhead blank may be machined to form the showerhead and/or core region. Machining may include forming a number of apertures through a core region of the showerhead and/or milling or otherwise machining the final dimensions of the showerhead and/or core region. In some embodiments, the core region may include an inner core region and an outer core region that is disposed about an outer periphery of the inner core region. The inner core region may be machined or otherwise formed to define a number of apertures therethrough. The outer core region may be machined and/or otherwise formed to define a channel that receives a heating element. The inner core region and outer core region may be coupled using a friction stir weld, diffusion bond, and/or an electron beam weld.

The showerhead and/or core region may be coated with aluminum and/or aluminum oxide at operation 420. For example, aluminum may be electroplated onto the showerhead and/or core region. Aluminum oxide may be applied to the showerhead and/or core region using atomic layer deposition. The coating may help prevent trace metal contamination of metallic elements within the aluminum alloy that may otherwise migrate out of the aluminum alloy when exposed to high temperatures during processing and/or cleaning operations.

In embodiments in which only a core region of a showerhead are formed, method 400 may optionally include joining a peripheral edge of the core region of the showerhead with an annular liner at operation 425. The annular liner may have a lower thermal conductivity than the core region of the showerhead, which may help the annular liner thermally shield heat sensitive components, such as O-rings, from high showerhead temperatures. The peripheral edge of the core region of the showerhead may be joined with the annular liner using a solid-state joining technique, such as friction stir welding. In some embodiments, joining the peripheral edge of the core region of the showerhead with the annular liner may include coupling an intermediate material between the peripheral edge of the core region and the annular liner. The intermediate material may be joined with the core region and/or the annular liner using a solid-state joining technique, such as friction stir welding. The intermediate material may have a coefficient of thermal expansion that is between a coefficient of thermal expansion of the core region and a coefficient of thermal expansion of the annular liner. This may enable an aluminum alloy and annular liner material to be selected primarily based on thermal conductivity considerations, with the intermediate material bridging a gap between the coefficients of thermal expansion of the core region and annular liner.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of manufacturing a semiconductor processing chamber showerhead, the method comprising:
   forming a melted aluminum alloy composition;
   cooling the melted aluminum alloy composition at a rate of at least 103 K/sec to form solid aluminum alloy particles;
   forming a core region of a showerhead from the solid aluminum alloy particles, wherein:
   the core region of the showerhead comprises an inner core region and an outer core region that is disposed about an outer periphery of the inner core region;
   the inner core region and the outer core region are coupled together;
   the inner core region defines a plurality of apertures; and
   the outer core region defines a channel that receives a heating element;
   coating the core region with one of aluminum or aluminum oxide; and
   joining a peripheral edge of the outer core region with an inner edge of a metallic annular liner, wherein the metallic annular liner comprises a lower thermal conductivity than the core region of the showerhead.

2. The method of manufacturing a semiconductor processing chamber showerhead of claim 1, wherein:
   forming the showerhead comprises:
   compacting the solid aluminum alloy particles;
   forming a showerhead blank from the compacted solid aluminum alloy particles; and
   machining the showerhead blank to form the showerhead.

3. The method of manufacturing a semiconductor processing chamber showerhead of claim 2, wherein:
   forming the showerhead further comprises forging or extruding the compacted solid aluminum alloy particles prior to forming the showerhead blank.

4. The method of manufacturing a semiconductor processing chamber showerhead of claim 1, wherein:
   coating the showerhead comprises electroplating aluminum onto the showerhead.

5. The method of manufacturing a semiconductor processing chamber showerhead of claim 1, wherein:
   coating the showerhead comprises applying aluminum oxide onto the showerhead via atomic layer deposition.

6. The method of manufacturing a semiconductor processing chamber showerhead of claim 1, wherein:
   an aluminum alloy portion of the showerhead comprises an electrical resistivity of less than 10 microohm cm.

7. The method of manufacturing a semiconductor processing chamber showerhead of claim 1, wherein:
   an aluminum alloy portion of the showerhead comprises a thermal conductivity of at least 100 W/m K.

8. The method of manufacturing a semiconductor processing chamber showerhead of claim 1, wherein:
cooling the melted aluminum alloy composition comprises one or more selected from a group comprising flash freezing, quenching, and powder atomization.

9. The method of manufacturing a semiconductor processing chamber showerhead of claim 1, further comprising:
coupling the inner core region and the outer core region using one or both of a friction stir weld or an electron beam weld.

10. The method of manufacturing a semiconductor processing chamber showerhead of claim 1, wherein:
joining the peripheral edge of the outer core region of the showerhead with the metallic annular liner comprises using a solid-state joining technique.

11. The method of manufacturing a semiconductor processing chamber showerhead of claim 1, wherein:
joining the peripheral edge of the outer core region of the showerhead with the metallic annular liner comprises coupling an intermediate material between the peripheral edge of the outer core region and the metallic annular liner; and
the intermediate material has a coefficient of thermal expansion that is between a coefficient of thermal expansion of the core region and a coefficient of thermal expansion of the metallic annular liner.

* * * * *